(12) United States Patent
Bain et al.

(10) Patent No.: US 7,567,423 B2
(45) Date of Patent: Jul. 28, 2009

(54) PRESSURE ASSISTED WAFER HOLDING APPARATUS AND CONTROL METHOD

(75) Inventors: David J. Bain, Newburgh, NY (US); Christopher S. Bichard, Pine Bush, NY (US); Keith Hwong-Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/248,105

(22) Filed: Oct. 9, 2008

(65) Prior Publication Data

US 2009/0034151 A1 Feb. 5, 2009

Related U.S. Application Data

(63) Continuation of application No. 10/710,653, filed on Jul. 27, 2004, now Pat. No. 7,457,097.

(51) Int. Cl.
H02N 13/00 (2006.01)
H02H 1/00 (2006.01)
(52) U.S. Cl. .................................................. 361/234
(58) Field of Classification Search ................. 361/234
See application file for complete search history.

(56) References Cited

U.S. PATENT DOCUMENTS

| 5,413,360 | A | 5/1995 | Atari et al. |
|---|---|---|---|
| 5,522,131 | A | 6/1996 | Steger |
| 5,542,559 | A | 8/1996 | Kawakami et al. |
| 5,665,166 | A | 9/1997 | Deguchi et al. |
| 5,812,361 | A | 9/1998 | Jones et al. |
| 6,084,763 | A | 7/2000 | Hirano et al. |
| 6,370,006 | B1 | 4/2002 | Kumar et al. |
| 6,414,834 | B1 | 7/2002 | Weldon et al. |
| 6,500,686 | B2 | 12/2002 | Katata et al. |
| 6,557,248 | B1 | 5/2003 | Shamouilian et al. |
| 6,581,275 | B2 | 6/2003 | Narendrnath et al. |
| 6,922,324 | B1 * | 7/2005 | Horwitz ...................... 361/234 |
| 6,946,403 | B2 | 9/2005 | Kellerman et al. |
| 6,974,709 | B2 | 12/2005 | Breitschwerdt et al. |
| 7,033,443 | B2 | 4/2006 | Kellerman et al. |
| 7,040,525 | B2 | 5/2006 | Lee et al. |
| 7,457,097 | B2 * | 11/2008 | Bain et al. .................. 361/234 |
| 2004/0083975 | A1 | 5/2004 | Tong et al. |
| 2008/0302481 | A1 * | 12/2008 | Berger et al. ................ 156/344 |

* cited by examiner

Primary Examiner—Ronald W Leja
(74) Attorney, Agent, or Firm—Cantor Colburn LLP; Joseph Petrokaitis

(57) ABSTRACT

An electrostatic wafer holding apparatus includes an electrostatic chucking pedestal and a bi-directional backside conduit in fluid communication with a backside of the chucking pedestal. The bi-directional backside conduit is in fluid communication with a backside carrier gas supply line, and is further in fluid communication with a vacuum supply line.

6 Claims, 5 Drawing Sheets

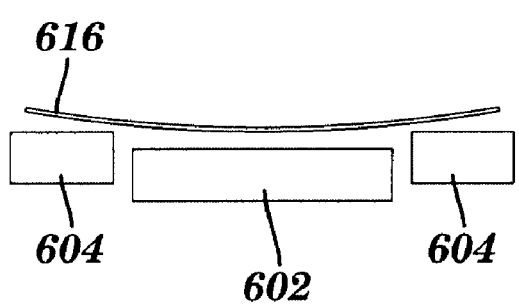 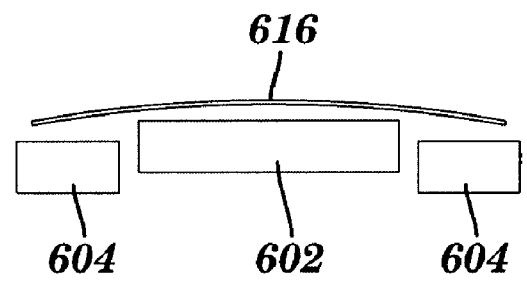
FIG. 8(a) FIG. 8(b)

PRESSURE ASSISTED WAFER HOLDING APPARATUS AND CONTROL METHOD

CROSS-REFERENCE TO RELATED APPLICATION

This application is a continuation of U.S. patent application Ser. No. 10/710,653, filed Jul. 27, 2004, the disclosure of which is incorporated by reference herein in its entirety.

BACKGROUND

The present invention relates generally to semiconductor device processing equipment, and, more particularly, to a pressure assisted, electrostatic wafer holding apparatus and control method.

Chucks are used in various material processing systems to retain workpieces (e.g., semiconductor wafers, dielectric substrates, etc.) thereon in a mechanically stationary position while the system process the workpiece. In particular, semiconductor wafer chucks are used to hold substrates in place and/or provide a heat transfer medium to the substrate for various processing steps (e.g., chemical vapor deposition, sputtering, etching, etc.) implemented during the manufacture of semiconductor devices such as integrated circuits.

There are three general types of chuck mechanism implementations that may be found in existing industrial wafer processing tools: gravity-based chucks, mechanical chucks and electrostatic chucks. In a gravity based chuck, a wafer is free standing on the chuck and simply held in place by gravity. While this design is the simplest of the three, a significant drawback thereof is the fact that there is an uncontrollable amount of contact between the wafer and the chuck. This is particularly disadvantageous for processes requiring heat transfer between the wafer and the chuck, and especially in low-vacuum processing environments, as this results in a highly non-uniform temperature gradient on the wafer. In turn, this leads to poor thickness control (e.g., for CVD/ALD processes), as well as variations in film properties.

In a mechanical chuck, a wafer is mechanically clamped to the chuck by means of a retention device, such as an edge ring. While this approach works fairly well for wafers that are somewhat bowed, the use of a mechanical retaining device can generate contaminating particles, as well as create a shadowing effect around the edge of the wafer. In fact, mechanically based chucks are virtually non-existent for semiconductor tooling of 300 mm wafer sizes.

On the other hand, an electrostatic chuck (ESC) retains a wafer thereon by generating a charge differential between a surface of the wafer and one or more electrodes located within the body of the chuck. The ensuing electrostatic force developed between the wafer and the electrodes retains the wafer against the chuck body. The electrodes are typically insulated from the wafer by a relatively thin layer of dielectric material. There are several well-known techniques for generating the electrostatic force in an electrostatic chuck. In addition, a typical ESC has an array of raised bumps, the surfaces of which are coated with certain semi-conducting composites such that a high electric field may be established, but not so as to excessively overload the power supply. For example, when a DC voltage ranging from about 200 volts to about 750 volts is applied to the chuck, an electrostatic attraction between the wafer and the chuck is established. This will generally create good contact without the drawbacks associated with a mechanical chuck.

However, although electrostatic chucks are extensively used in many 200 mm and 300 mm tool sets, there are still some disadvantages associated with electrostatic chucking. For example, electrostatic chucking force is a function of temperature, as well as the backside material of the wafer. While a higher chucking force may be obtained at a higher chuck and wafer temperature, the raising of the wafer temperature may not be a viable option for certain processes if the raised temperature changes the nature and/or rate of the particular process. Furthermore, for wafers that are more severely bowed (particularly, for a compressively bowed wafer stack), there is insufficient initial contact between the backside of the wafer and the chuck to take advantage of the generated electrostatic forces for adequate retention.

Accordingly, it would be desirable to be able to implement a chucking apparatus and method that advantageously utilizes the advantages of both electrostatic and mechanical chucking, but that does not suffer from the drawbacks associated therewith.

SUMMARY

The foregoing discussed drawbacks and deficiencies of the prior art are overcome or alleviated by an electrostatic wafer holding apparatus. In an exemplary embodiment, the apparatus includes an electrostatic chucking pedestal and a bi-directional backside conduit in fluid communication with a backside of the chucking pedestal. The bi-directional backside conduit is in fluid communication with a backside carrier gas supply line, and is further in fluid communication with a vacuum supply line.

In another embodiment, an electrostatic wafer holding apparatus includes an electrostatic chucking pedestal having an inner zone and an outer zone. A bi-directional backside conduit is in fluid communication with a backside of the chucking pedestal, and is in fluid communication with a backside carrier gas supply line. The bi-directional backside conduit is further in fluid communication with a vacuum supply line. The inner zone and the outer zone of the chucking pedestal are mechanically decoupled from one another.

In still another embodiment, a method for implementing pressure assisted electrostatic chucking includes placing a wafer onto an electrostatic chucking pedestal, and introducing a supply of backside carrier gas to a backside of the electrostatic chucking pedestal. The pressure between the wafer and the electrostatic chucking pedestal is monitored to determine whether a threshold level of chucking force exists. The backside carrier gas is decoupled from the backside of said electrostatic chucking pedestal, and the backside of the electrostatic chucking pedestal is coupled to a vacuum supply whenever the actual level of chucking force is less than the threshold level of chucking force.

BRIEF DESCRIPTION OF THE DRAWINGS

Referring to the exemplary drawings wherein like elements are numbered alike in the several Figures:

FIG. 8(a) is a cross-sectional view of the dual-zone electrostatic chuck having a wafer characterized by a tensile film stack; and FIG. 8(b) is a cross-sectional view of the dual-zone electrostatic chuck having a wafer characterized by a compressive film stack.

DETAILED DESCRIPTION

Figure 1:
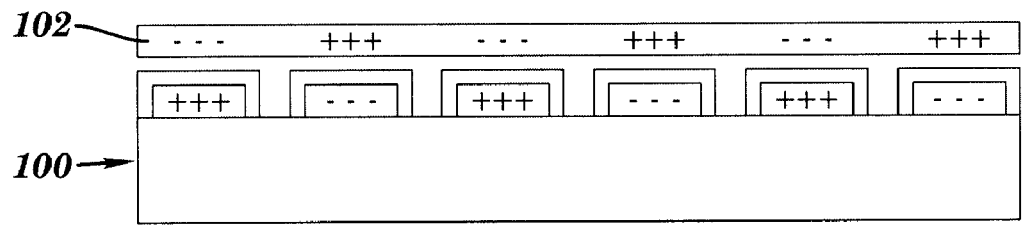
FIG. 1 is a cross-sectional view of an existing electrostatic chuck.
Figure 2:
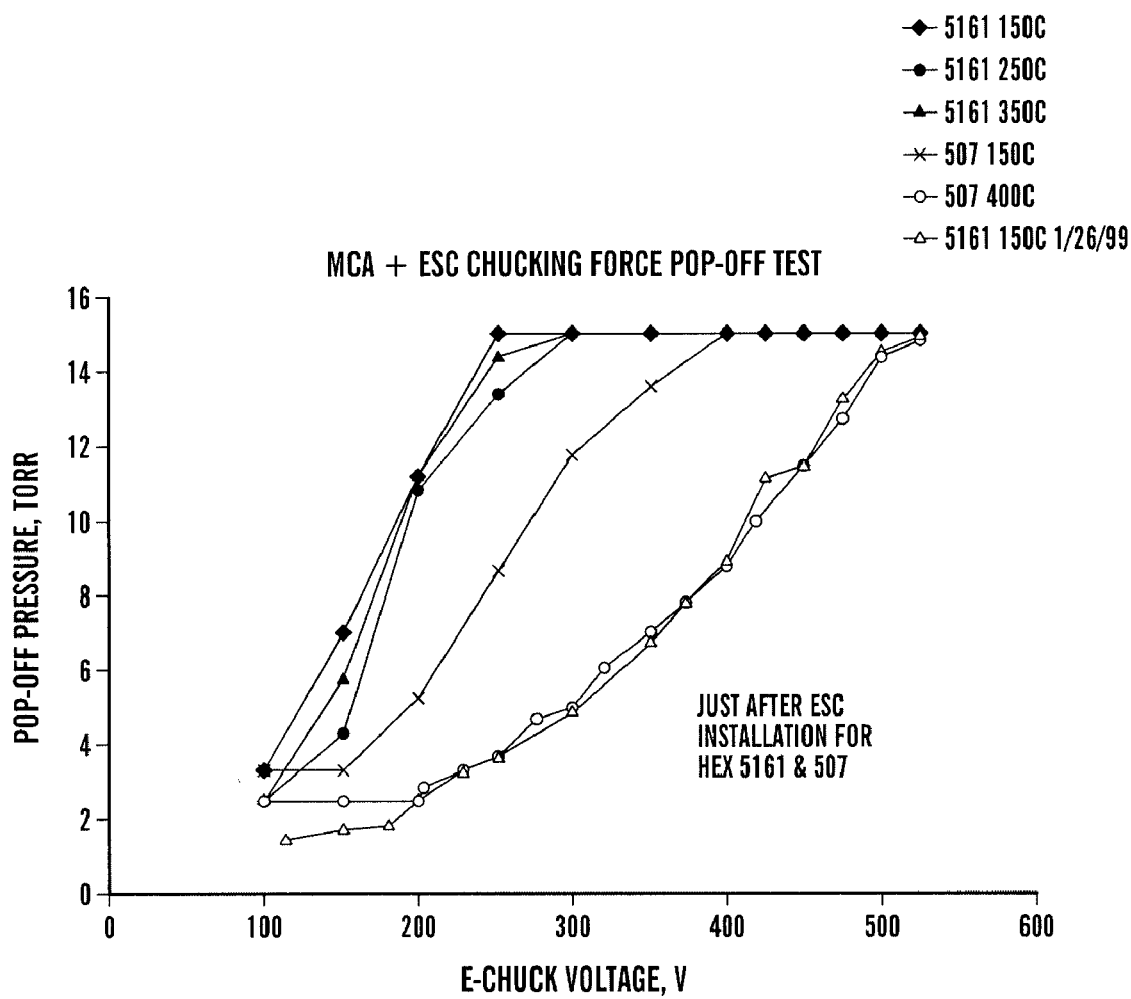
FIG. 2 is a graph that illustrates the effect of chucking force as a function of temperature.

Referring initially to FIG. 1, there is shown a cross-sectional view of an existing electrostatic chuck 100. As is known in the art, there are two main components of electrostatic chucking force. When a wafer 102 is first loaded onto the chuck 100, the gap size therebetween is relatively large and, as such, the main attractive force between the two is Coulombic in nature. Once the wafer 102 is attracted to the energized chuck 100 and begins to be flattened as a result, the stronger Johnsen-Rahbek force then becomes the dominant attractive force. However, as indicated previously, conventional electrostatic chucking has certain inherent deficiencies associated therewith. For example, FIG. 2 is a graph that illustrates the effect of chucking force as a function of temperature. Again, while a higher chucking force may be obtained at a higher chuck and wafer temperatures, this may not be a viable option for certain manufacturing processes.

Figure 3A:
FIG. 3(a) is a schematic view of a chuck and wafer characterized by a tensile film stack.
Figure 3B:
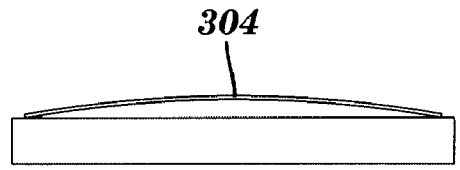
FIG. 3(b) is a schematic view of a chuck and wafer characterized by a compressive film stack.

Moreover, for severely bowed wafers (e.g., the concave wafer 302 of FIG. 3(a), the convex wafer 304 of FIG. 3(b)), there is not enough contact surface between the backside of the wafer and the chuck. This is particularly the case for wafers having a negative radius of curvature (i.e., convex wafers having a compressively stressed film stack). Thus, the gap distance therebetween is out of the operating range of the stronger Johnsen-Rahbek force. This has become a well-known problem, for example, in its inability to chuck certain SiGe wafers during aluminum stack deposition. Another specific difficulty arises in chucking 300 mm wafers for C4 plating liner seed deposition. For heavily bowed SiGe wafers, it may even be necessary to move the wafer to another deposition tool having mechanical clamps. During the deposition of a metal stack, such as Ti/TiN/Al/Ti/TiN, for example, metals such as Ti ad Al become oxidized in the presence of air. Thus, this is not a practical option and thus the wafer is scrapped as a result.

Figure 4A:
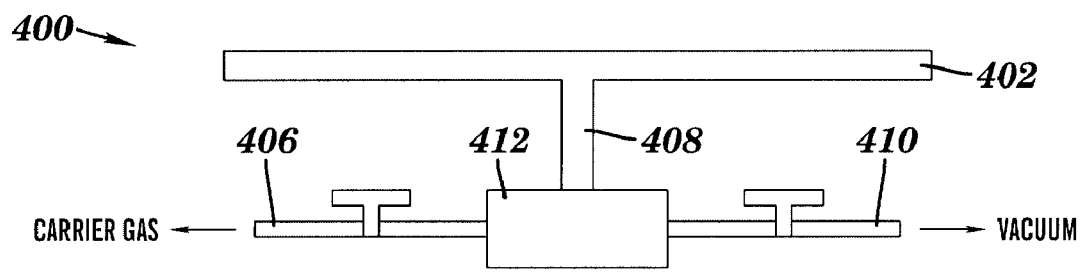
FIG. 4(a) is a cross-sectional view of a pressure assisted, electrostatic wafer holding apparatus, in accordance with an embodiment of the invention.
Figure 4B:
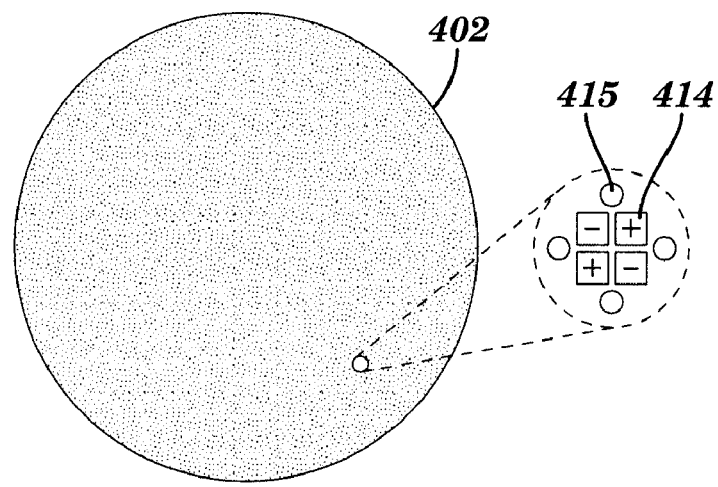
FIG. 4(b) is a top view of the pressure assisted, electrostatic wafer holding apparatus of FIG. 4(a), particularly illustrating the orientation of mini-dipoles on the raised bumps and gas channels of the chuck.

Therefore, in accordance with an embodiment of the invention, there is disclosed a pressure assisted, electrostatic wafer holding apparatus 400 that utilizes a bi-directional backside conduit. As shown more particularly in FIGS. 4(a) and 4(b), the apparatus 400 includes a chucking pedestal 402 with mini-dipoles 414 and gas channels 415. A backside supply line 406 is used to provide a carrier gas to the backside of the wafer through conduit 408 in fluid communication therewith, while a vacuum supply line 410 is also in selective fluid communication with conduit 406, and controlled by detection circuitry 412. FIG. 4(b) is a top view of the pressure assisted, electrostatic wafer holding apparatus 400 of FIG. 4(a), particularly illustrating the orientation of mini-dipoles 414 on the raised bumps of the chucking pedestal 402.

Under normal operation of apparatus 400, when a wafer applied thereto is relatively flat, the conduit 408 is used to flow a small amount of backside gas for wafer detection and operation, as well as to improve the thermal transport between the temperature controlled chuck and the wafer. On the other hand, if the film stack on the wafer is very compressive, for example, the detection circuitry 412 detects the large (negative) curvature and switches the gas conduit 408 to a vacuum mode of operation. Simultaneously, a front side gas flowing into the chamber (not shown) increases the pressure differential such that the wafer will be assisted in deflecting toward the chuck, thereby enabling the Johnsen-Rahbek force to take effect.

Figure 5:
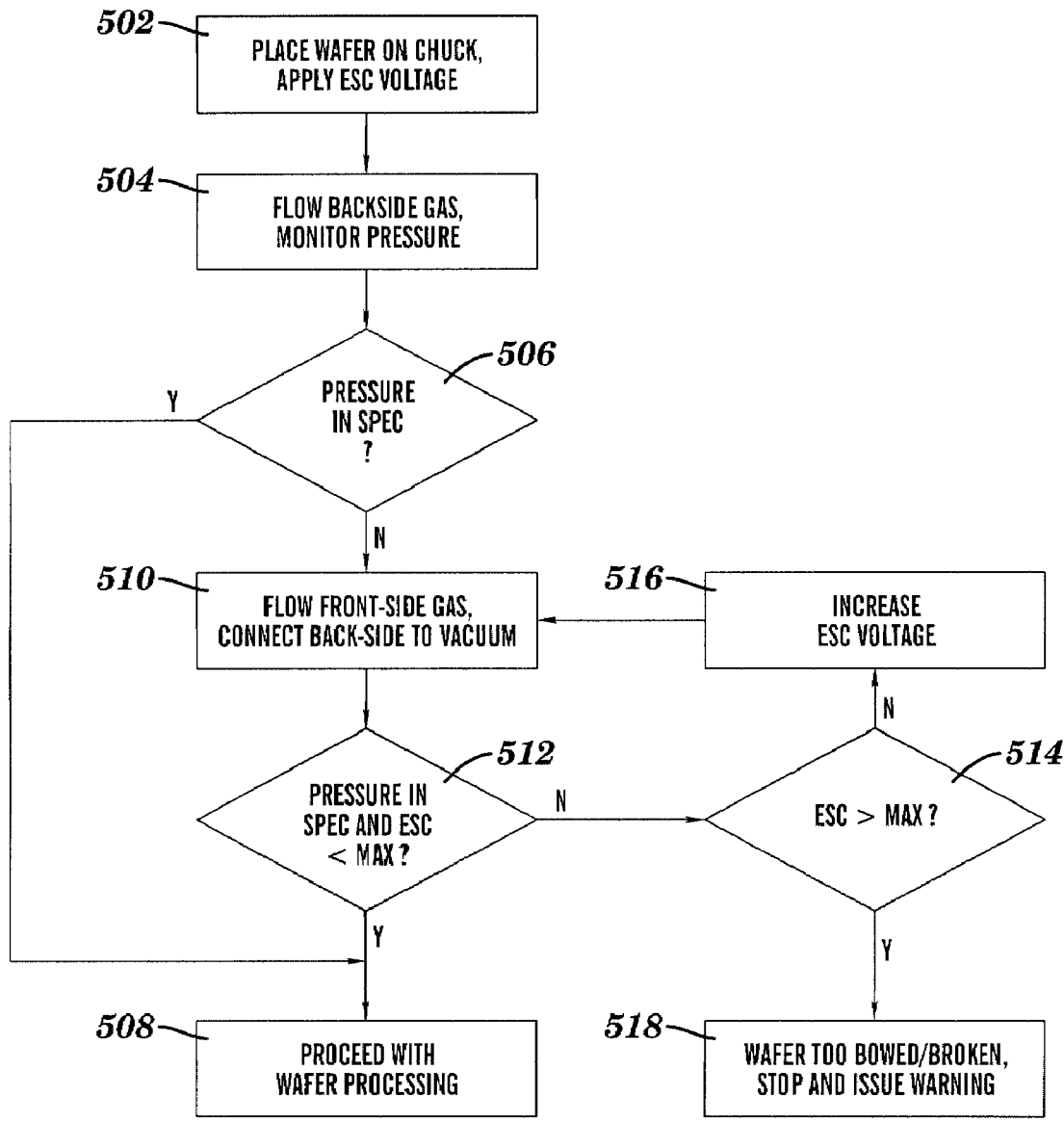
FIG. 5 is a process flow diagram of a method for implementing curvature assisted chucking, in accordance with a further embodiment of the invention.

Referring now to FIG. 5, there is shown a process flow diagram of a control method 500 for implementing pressure assisted electrostatic chucking, in accordance with a further embodiment of the invention. Beginning at block 502, a wafer is positioned on an electrostatic chuck, such as apparatus 400 described above, for example. Initially, a backside gas is supplied to the chuck pedestal and the resulting pressure between the wafer and chuck is monitored, as shown in block 504. If at decision block 506 it is determined that the pressure is within specified limits, then sufficient chucking force exists and thus normal wafer processing may proceed as shown at block 508.

However, if sufficient chucking force is not detected, then method 500 proceeds to block 510 where front side gas flow is introduced, and the gas conduit is coupled to the vacuum supply in an attempt to achieve sufficient chucking force. Then, decision block 512 again determines whether the pressure is now within specified limits. If this is the case, then the vacuum supply is removed, the backside gas supply is restored and normal wafer processing may proceed. However, if there is still insufficient chucking force, then method 500 proceeds to decision block 514 to see whether the electrostatic chuck voltage is less than the maximum allowed value. If the electrostatic chuck (ESC) voltage does not exceed the maximum value, then the ESC voltage is increased at block 516 before method 500 returns to block 512. This sequence may continue until the chucking force becomes sufficient or until the ESC voltage exceeds the maximum value. As further shown at decision block 514, when the ESC voltage exceeds the maximum value (and the pressure is still not within the specified limits), the process exits at 518, and the wafer is deemed to be too bowed (or broken), and will be scrapped as defective.

Figure 6:
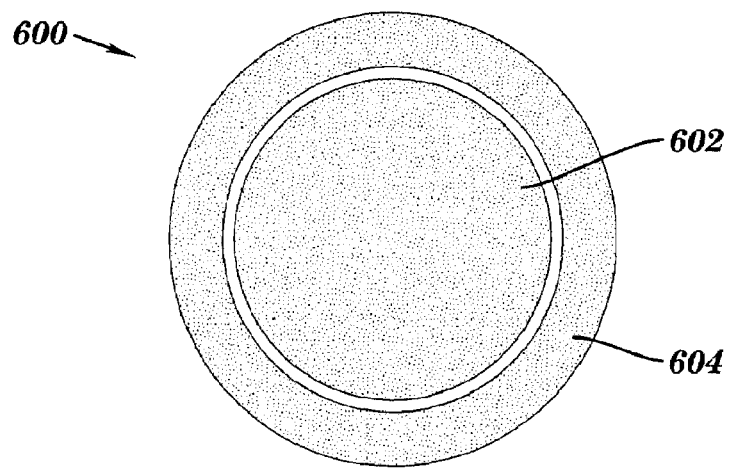
FIG. 6 is a top view of a dual-zone electrostatic chuck, in accordance with a further embodiment of the invention.
Figure 7:
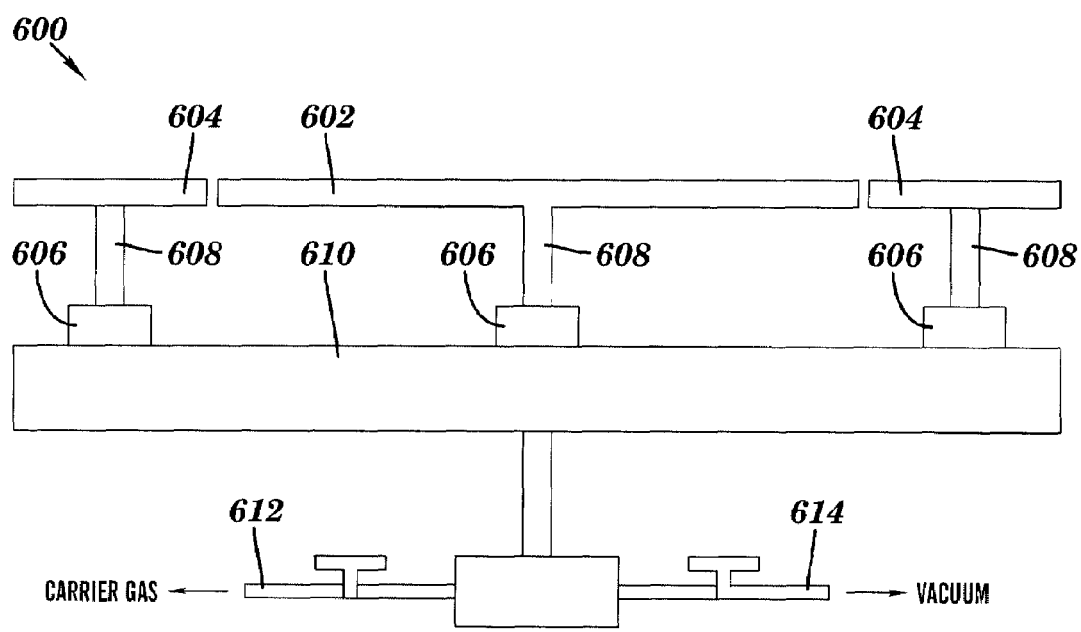
FIG. 7 is a cross-sectional view of the dual-zone electrostatic chuck of FIG. 6.

Referring generally now to FIGS. 6 and 7, there is shown a dual-zone electrostatic chuck 600, in accordance with an alternative embodiment of the invention, in which an inner zone 602 and an outer zone 604 are mechanically decoupled from one another. In particular, the height of the inner zone 602 is independently adjustable with respect to the height of the outer zone 604, and vice versa. As illustrated in FIG. 7, adjustment of the height of the zones may be accomplished through a suitable micro-positioning control mechanism, such as through stepping motor 606 and extendable shaft 608 assemblies mounted on a base 610. As is the case with the embodiment of FIGS. 4(a) and 4(b), the dual-zone ESC 600 is provided with both a carrier gas supply 612 and a vacuum supply 614.

The advantages of the dual-zone embodiment are appreciated upon consideration of the condition in which a wafer is curved either in a concave or a convex orientation. In the case where the wafer 616 has a relatively large radius of curvature, the micro-positioning control can raise the outer zone 604 slightly with respect to the inner zone 602 so as to bring the inner zone 602 in closer proximity to the center portion of the wafer 616, as shown in FIG. 8(*a*). Conversely, if the wafer 616 has a relatively large negative radius of curvature, then the outer zone 604 may be retracted slightly with respect to the inner zone 602 so as to bring the outer zone 604 in closer proximity to the outer portions of the wafer 616, as shown in FIG. 8(*b*). Once the bowed wafer is flattened due to the assisted electrostatic forces, the chucking voltages in both zones may be reduced before continuing with normal processing. In either instance, it will be seen that the closer physical proximity of the wafer and chuck pedestal using the dual-zone embodiment will further facilitate a stronger chucking force and improve device yield.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An electrostatic wafer holding apparatus, comprising:
   an electrostatic chucking pedestal configured for wafer retention thereupon, said electrostatic chucking pedestal having a plurality of gas channels formed through a top surface thereof;
   a bi-directional backside conduit in fluid communication with a backside of said chucking pedestal and said plurality of gas channels;
   said bi-directional backside conduit in fluid communication with a backside carrier gas supply line;
   said bi-directional backside conduit further in fluid communication with a vacuum supply line, wherein said plurality of gas channels are configured to facilitate vacuum assisted chucking of a wafer retained on said electrostatic chucking pedestal, during which vacuum assisted chucking an electrostatic chucking voltage remains applied to the electrostatic chucking pedestal, wherein the vacuum assisted chucking is implemented prior to performing a wafer processing operation for which the wafer is chucked;
   a mechanism for selectively coupling said bi-directional backside conduit to one of said backside carrier gas supply line and said vacuum supply line; and
   detection circuitry for detecting a curvature present in a wafer placed on said chucking pedestal, said detection circuitry configured to cause said bi-directional backside conduit to be decoupled from said backside carrier gas supply line and coupled to said vacuum supply line upon said detecting a curvature present in said wafer, and said detection circuitry further configured to cause said bi-directional backside conduit to be decoupled from said vacuum supply line and re-coupled to said backside carrier gas supply line upon detecting a desired pressure between said wafer and said chucking pedestal.

2. An electrostatic wafer holding apparatus, comprising:
   an electrostatic chucking pedestal configured for wafer retention thereupon, said chucking pedestal having an inner zone and an outer zone, the inner and outer zones each having a top surface disposed beneath a wafer placed on said chucking pedestal;
   a bi-directional backside conduit in fluid communication with a backside of said chucking pedestal;
   said bi-directional backside conduit in fluid communication with a backside carrier gas supply line;
   said bi-directional backside conduit further in fluid communication with a vacuum supply line;
   wherein said inner zone and said outer zone are mechanically decoupled from one another such that the top surface of the outer zone is capable of selective adjustment to positions both below and above the top surface of the inner zone; and
   wherein said electrostatic chucking pedestal further comprises a plurality of gas channels formed through a top surface thereof, said plurality of gas channels also in fluid communication with said bi-directional backside conduit, and wherein said plurality of gas channels are configured to facilitate vacuum assisted chucking of a wafer retained on said electrostatic chucking pedestal, during which vacuum assisted chucking an electrostatic chucking voltage remains applied to the electrostatic chucking pedestal, and wherein the vacuum assisted chucking is implemented prior to performing a wafer processing operation for which the wafer is chucked;
   a mechanism for selectively coupling said bi-directional backside conduit to one of said backside carrier gas supply line and said vacuum supply line; and
   detection circuitry for detecting a curvature present in a wafer placed on said chucking pedestal, wherein said detection circuitry is configured to cause said bi-directional backside conduit to be decoupled from said backside carrier gas supply line and coupled to said vacuum supply line upon said detecting a curvature present in said wafer, and wherein said detection circuitry is further configured to cause said bi-directional backside conduit to be decoupled from said vacuum supply line and re-coupled to said backside carrier gas supply line upon detecting a desired pressure between said wafer and said chucking pedestal.

3. The apparatus of claim 2, further comprising a suitable micro-positioning control mechanism associated with each of said inner and outer zones of said chucking pedestal, wherein a height of said inner and outer zones are independently adjustable with respect to one another.

4. The apparatus of claim 3, wherein said outer zone is configured to be in a raised position with respect to said inner zone when a wafer having a positive radius of curvature with respect to said chucking pedestal is placed upon said chucking pedestal.

5. The apparatus of claim 4, wherein said inner zone is configured to be in a raised position with respect to said outer zone when a wafer having a negative radius of curvature with respect to said chucking pedestal is placed upon said chucking pedestal.

6. The apparatus of claim 2, wherein said inner zone is concentrically disposed with respect to said outer zone.

* * * * *